(12) United States Patent
Kinjou et al.

(10) Patent No.: US 9,184,736 B2
(45) Date of Patent: Nov. 10, 2015

(54) CURRENT MODE CONTROLLED POWER CONVERTER

(71) Applicant: DENSO CORPORATION, Kariya, Aichi-pref. (JP)

(72) Inventors: Hirofumi Kinjou, Nagoya (JP); Yuji Hayashi, Kasugai (JP); Keiji Shigeoka, Nishio (JP); Kimikazu Nakamura, Handa (JP)

(73) Assignee: DENSO CORPORATION, Kariya (JP)

( * ) Notice: Subject to any disclaimer, the term of this patent is extended or adjusted under 35 U.S.C. 154(b) by 294 days.

(21) Appl. No.: 14/015,480

(22) Filed: Aug. 30, 2013

(65) Prior Publication Data
US 2014/0062558 A1 Mar. 6, 2014

(30) Foreign Application Priority Data
Aug. 31, 2012 (JP) ................... 2012-192149

(51) Int. Cl.
*H02M 3/135* (2006.01)
*H03K 5/12* (2006.01)
(52) U.S. Cl.
CPC ........................................ *H03K 5/12* (2013.01)
(58) Field of Classification Search
USPC ............... 363/16–26, 49, 52–53, 125–127
See application file for complete search history.

(56) References Cited

U.S. PATENT DOCUMENTS

| | | | | |
|---|---|---|---|---|
| 7,936,160 | B1 * | 5/2011 | Sheehan | 323/285 |
| 2005/0258814 | A1 * | 11/2005 | Chen et al. | 323/285 |
| 2008/0068866 | A1 * | 3/2008 | Blanken | 363/21.01 |
| 2008/0218142 | A1 * | 9/2008 | Uehara | 323/282 |
| 2009/0322299 | A1 * | 12/2009 | Michishita et al. | 323/282 |
| 2010/0320973 | A1 * | 12/2010 | Nishida | 320/145 |
| 2011/0101932 | A1 | 5/2011 | Nakazono | |
| 2011/0187336 | A1 * | 8/2011 | Wu et al. | 323/282 |
| 2011/0241641 | A1 * | 10/2011 | Chen et al. | 323/284 |
| 2012/0049825 | A1 * | 3/2012 | Chen et al. | 323/284 |
| 2012/0176824 | A1 * | 7/2012 | Franklin et al. | 363/79 |
| 2013/0336014 | A1 * | 12/2013 | Kinjou et al. | 363/21.01 |
| 2014/0098538 | A1 * | 4/2014 | De Vaal | 362/249.02 |
| 2014/0226369 | A1 * | 8/2014 | Kimura et al. | 363/21.09 |

FOREIGN PATENT DOCUMENTS

| | | |
|---|---|---|
| JP | 2006-033958 | 2/2006 |
| JP | 2008-510443 | 4/2008 |
| JP | 2010-200517 | 9/2010 |
| JP | 2011-101479 | 5/2011 |
| JP | 2012-080756 | 4/2012 |
| JP | 2013-074657 | 4/2013 |
| JP | 2013-150490 | 8/2013 |

OTHER PUBLICATIONS

T, Grote et al., "Adaptive Digital Slope Compensation for Peak Current Mode Control", IEEE ECCE 2009, vol. 6, 7 pages, Sep. 2009.

* cited by examiner

*Primary Examiner* — Adolf Berhane
*Assistant Examiner* — Nusrat Quddus
(74) *Attorney, Agent, or Firm* — Nixon & Vanderhye PC

(57) ABSTRACT

A current mode controlled power converter controllable in a digitally processing current mode even during an on time. In the power converter, each control period based on a reference signal includes a slope calculation period in which a slope compensation signal for the control period is calculated by a slope compensation unit. During each slope calculation period, the slope compensation unit negates the slope compensation signal calculated previous to the control period including the slope calculation period, and a reset signal generation unit compares a current detection signal detected by a current detection unit with a current instruction set to an error signal generated by an error signal generation unit to generate a reset signal.

12 Claims, 7 Drawing Sheets

CURRENT MODE CONTROLLED POWER CONVERTER

CROSS-REFERENCE TO RELATED APPLICATION

This application is based on and claims the benefit of priority from earlier Japanese Patent Application No. 2012-192149 filed Aug. 31, 2012, the description of which is incorporated herein by reference.

BACKGROUND

1. Technical Field

The present invention relates to a current mode controlled power converter.

2. Related Art

A current mode controlled power converter essentially includes slope compensation means for preventing subharmonic oscillation and needs an external slope circuit to implement the slope compensation means.

An example of technique used in a known DC-DC converter as disclosed in Japanese Patent Application Laid-Open Publication No. 2011-101479 is intended to implement slope compensation upon dynamic changes in output voltage while allowing for stable operation with low power consumption and high efficiency. This DC-DC converter includes an output voltage setting register for storing a voltage setting value corresponding to a target output voltage value, and a slope compensation circuit which generates a slope compensation signal having a slope compensation amount corresponding to the stored voltage setting value.

The DC-DC converter disclosed in Japanese Patent Application Laid-Open Publication No. 2011-101479 eliminates an analog circuit that feedbacks an output voltage by providing the output voltage setting register, but includes a slope compensation circuit in place of the analog circuit. The slope compensation circuit receives a slope compensation amount reference voltage from a slope compensation DAC and a periodic signal from an oscillation circuit to generate a slope compensation signal having a sawtooth wave shape. Implementation of such an analog slope compensation value calculation circuit will inevitably lead to an increase of number of components, which may increase not only manufacturing costs, but also converter dimensions.

A digital slope calculation circuit would be able to overcome the above disadvantages, where the slope compensation is digitally processed in a microcomputer. Digitally processing the slope compensation in the microcomputer will, however, lead to an updating delay such that the timing of updating a current instruction is delayed by a calculation time required to calculate the current instruction. In the presence of such an updating delay, an on time corresponding to a duty ratio of a pulse signal less than the calculation time will disable voltage control. Therefore, only with digitally processing of the slope compensation in the microcomputer, there is another disadvantage that the on time has to be greater than the calculation time. Although a microcomputer operable at high frequencies is able to reduce the on time, the on time will still have to be greater than the calculation time, which leads to still another disadvantage that the microcomputer becomes more expensive.

Load variations and the like may cause a current reference signal (Iref) to change at time t65 as shown in FIG. 12, where a slope compensation signal calculated previous to a control cycle of time t65 to time t69 may remain, for example, at time t66, which gives rise to a further disadvantage that the voltage control is disabled until completion of the calculation and the DC-DC converter may malfunction at an improper duty ratio.

In consideration of the foregoing, it would therefore be desirable to have a power converter controllable in a digitally processing current mode even during an on time and able to reduce manufacturing costs and converter dimensions.

SUMMARY

In accordance with an exemplary embodiment of the present invention, there is provided a current mode controlled power converter including: a switching unit configured to convert an input voltage into a desired output voltage through a switching operation; a current detection unit configured to detect a current flowing through the switching unit; an input voltage detection unit configured to detect the input voltage; an output voltage detection unit configured to detect the output voltage; an error signal generation unit configured to generate an error signal on the basis of the output voltage detected by the output voltage detection unit and a voltage instruction value; a slope compensation unit configured to calculate and output a slope compensation signal on the basis of the current detection signal, the input voltage, and the output voltage; a reset signal generation unit configured to generate a reset signal on the basis of the current detection signal, the error signal, and the slope compensation signal; a reference signal generation unit configured to generate a reference signal having a predetermined period; and a drive unit configured to generate a drive signal on the basis of the reset signal and the reference signal to drive the switching unit.

In the power converter, each control period based on the reference signal includes a slope calculation period in which the slope compensation signal for the control period is calculated. During each slope calculation period, the slope compensation unit negates the slope compensation signal calculated previous to the control period including the slope calculation period, and the reset signal generation unit compares the current detection signal with a current instruction set to the error signal to generate the reset signal.

In this configuration, for each control period based on the reference signal, the slope compensation signal calculated previous to or prior to the control period is negated during the slope calculation period, and the reset signal is generated on the basis of the error signal. This can prevent subharmonic oscillation reliably from occurring irrespective of the duty ratio and allows an input and output voltage range available for the digital current mode control to be extended. Further, this enables the digital current mode control even during an on time, and can reduce manufacturing costs and converter dimensions.

In one embodiment, the reset signal generation unit may configured to negate the slope compensation signal on the basis of the reference signal or the reset signal. This can prevent subharmonic oscillation more reliably from occurring irrespective of the duty ratio.

In one embodiment, the reset signal generation unit may be configured such that the timing of updating the current instruction to the second current instruction or the timing of updating the comparative signal to the second comparative signal is within a time period from the calculation completion of the slope compensation signal to the timing at which the duty ratio becomes 0.5 (50%). This can prevent subharmonic oscillation more reliably from occurring irrespective of the duty ratio.

DESCRIPTION OF SPECIFIC EMBODIMENTS

The present invention will now be described more fully hereinafter with reference to the accompanying drawings. The terms "connecting" and "being connected" refer to electrically connecting and being electrically connected, respectively, except where specified otherwise.

First Embodiment

Figure 1:
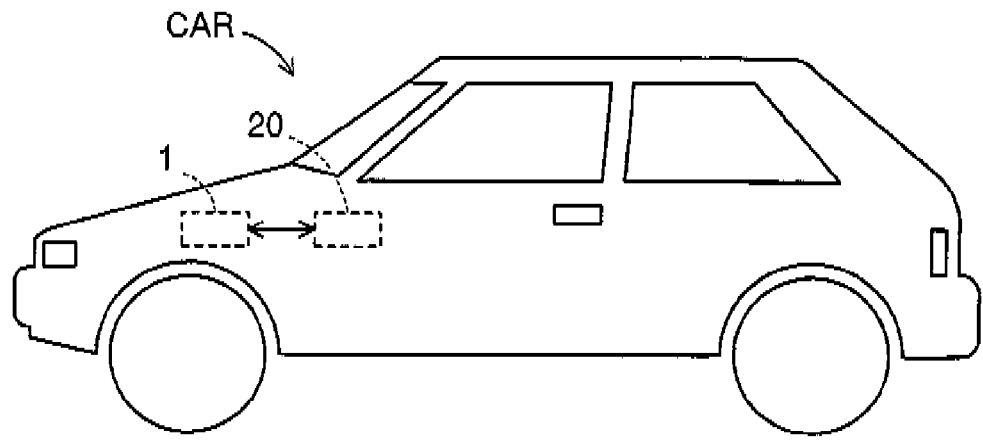
FIG. 1 shows a vehicle to which the present invention may be applied.
Figure 2:
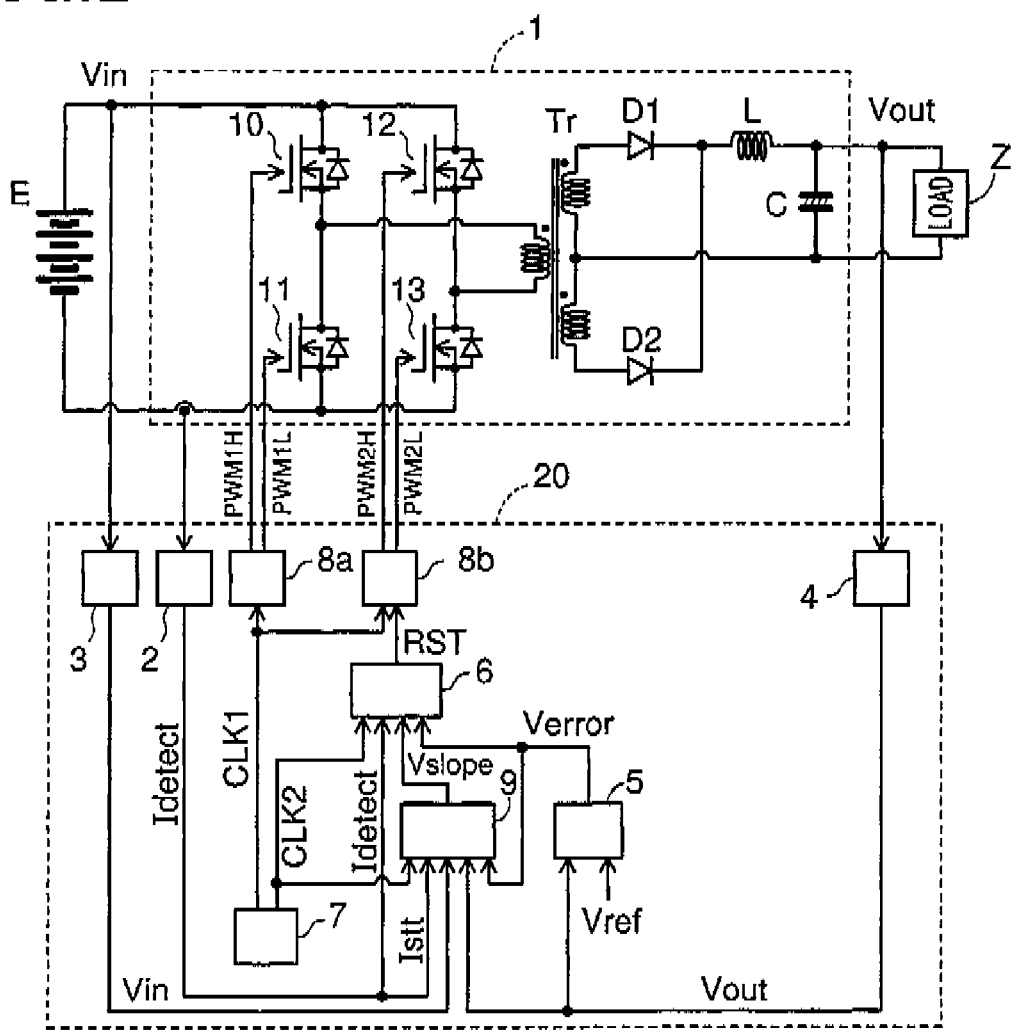
FIG. 2 shows a schematic circuit diagram of a power converter in accordance with a first embodiment of the present invention.

There will now be explained a first embodiment with reference to FIG. 1 to FIG. 5, and FIG. 11, where, for each control cycle, a slope compensation signal calculated on the basis of an error signal prior to the control cycle is negated. A car shown in FIG. 1 is provided with a power converter including a switching section 1 and a control section 20. The switching section 1 and the control section 20 may be separate from each other, where the switching section 1 may also be referred to as a switching unit, or may be integrated together. FIG. 2 shows an exemplary configuration of the switching section 1 and the control section 20.

As shown in FIG. 2, the switching section 1, which serves as a so called DC-DC converter, converts an input voltage value Vin into a desired voltage value through the switching operation and outputs the voltage of the desired voltage value. The switching section 1 includes switching modules 10, 11, 12, 13, a transformer Tr, diodes D1, D2, a reactor L (coil), a capacitor C and others.

Each of the switching modules 10, 11, 12, 13 includes a switching element (N-channel MOSFET) and a diode electrically connected in parallel therewith. The diode serves as a freewheel diode regardless of whether the diode is included in the switching element.

The upper-arm switching module 10 and the lower-arm switching module 11 are electrically connected in series with each other. The upper-arm switching module 12 and the lower arm switching module 13 are electrically connected in series with each other. The series connection of the switching modules 10, 11 and the series connection of the switching modules 12, 13 are electrically connected in parallel with each other. A junction between the switching module 10 and the switching module 11 is electrically connected to the primary of the transformer Tr (more specifically, to one of the primary terminals). A junction between the switching module 12 and the switching module 13 is electrically connected to the primary of the transformer Tr (more specifically, to the other one of the primary terminals).

The switching modules 10, 11 are driven by drive signals PWM1H, PWM1L generated in a drive unit 8a. The switching module 12, 13 are driven by drive signals PWM2H, PWM2L generated in a drive unit 8b. The generation of the drive signals PWM1H, PWM1L, PWM2H, PWM2L will be described later in more detail.

The transformer Tr includes, in addition to the primary terminals, at least three secondary terminals. More specifically, the transformer Tr outputs two phase voltages relative to a potential on the center terminal (center tap). The two phase voltages are full-wave rectified via the diodes D1, D2 and smoothed via the reactor L and the capacitor C to be outputted to one of terminals of the electrical load Z. The center terminal of the transformer Tr is electrically connected to the other terminal of the load Z. A turns ratio n of the transformer Tr is given by n1/n2, where n1 is the number of primary winding turns of the transformer Tr and n2 is the number of secondary winding turns of the transformer Tr. Arbitrary coil may be used for the reactor L. In the present embodiment, a choke coil is used for the reactor L.

The control section 20 shown in FIG. 2 controls the switching modules 10, 11, 12, 13 to be driven so that an output voltage value Vout from the switching section 1 to the electrical load 2 becomes a desired voltage value. The control section 20 includes a current detection unit 2, an input voltage detection unit 3, an output voltage detection unit 4, an error signal generation unit 5, a reset signal generation unit 6, a reference signal generation unit 7, the drive units 8a, 8b, a slope compensation unit 9, and others.

The current detection unit 2 detects a current following through the switching section 1 and outputs a current detection signal Idetect. The input voltage detection unit 3 detects a voltage inputted to the switching section 1 and outputs an input voltage value Vin. The output voltage detection unit 4 detects a voltage outputted from the switching section 1 and outputs an output voltage value Vout.

The error signal generation unit 5 generates and outputs an error signal Verror on the basis of the output voltage value Vout detected by the output voltage detection unit 4 and a voltage instruction value Vref corresponding to the desired voltage value. The reference signal generation unit 7 generates and outputs reference signals CLK1, CLK2 having respective predetermined periods.

The slope compensation unit 9 generates and outputs a slope compensation signal Vslope on the basis of an input voltage value Vin detected by the input voltage detection unit 3, the output voltage value Vout detected by the output voltage detection unit 4, the error signal Verror outputted from the error signal generation unit 5, and a current initial value Istt of the current detection signal Idetect. The slope compensation unit 9 acquires at least one of the error signal Verror, the input voltage value Vin, the output voltage value Vout, prior to the present control cycle Ttctrl.

The reset signal generation unit 6 compares the current detection signal Idetect detected by the current detection unit 2 with the current reference signal Iref. The current reference signal Tref, indicated by a dashed line and also called a current instruction signal (also denoted by Iorder), is acquired by subtracting the slope compensation signal Vslope from the error signal Verror (i.e., Iref=Verror−Vslope). When the current detection signal Idetect exceeds the current reference signal Iref, a reset signal RST is outputted from the reset signal generation unit 6 for the switching turn off operation. The reset signal RST is reset on the basis of or in response to the reference signal CLK2 outputted from the reference signal generation unit 7.

The drive unit 8a generates the drive signals PWM1H, PWM1L on the basis of the reference signal CLK1 outputted from the reference signal generation unit 7 for driving the switching modules 10, 11, where the drive signals PWM1H, PWM1L are logically inversed when the reference signal CLK1 is logically inversed. The drive unit 8b generates the drive signals PWM2H, PWM2L on the basis of the reset signal RST and the reference signals CLK1 CLK2 for driving the switching modules 12, 13, where the drive signals PWM2H, PWM2L are logically inversed when the reset signal RST is outputted.

Figure 3:
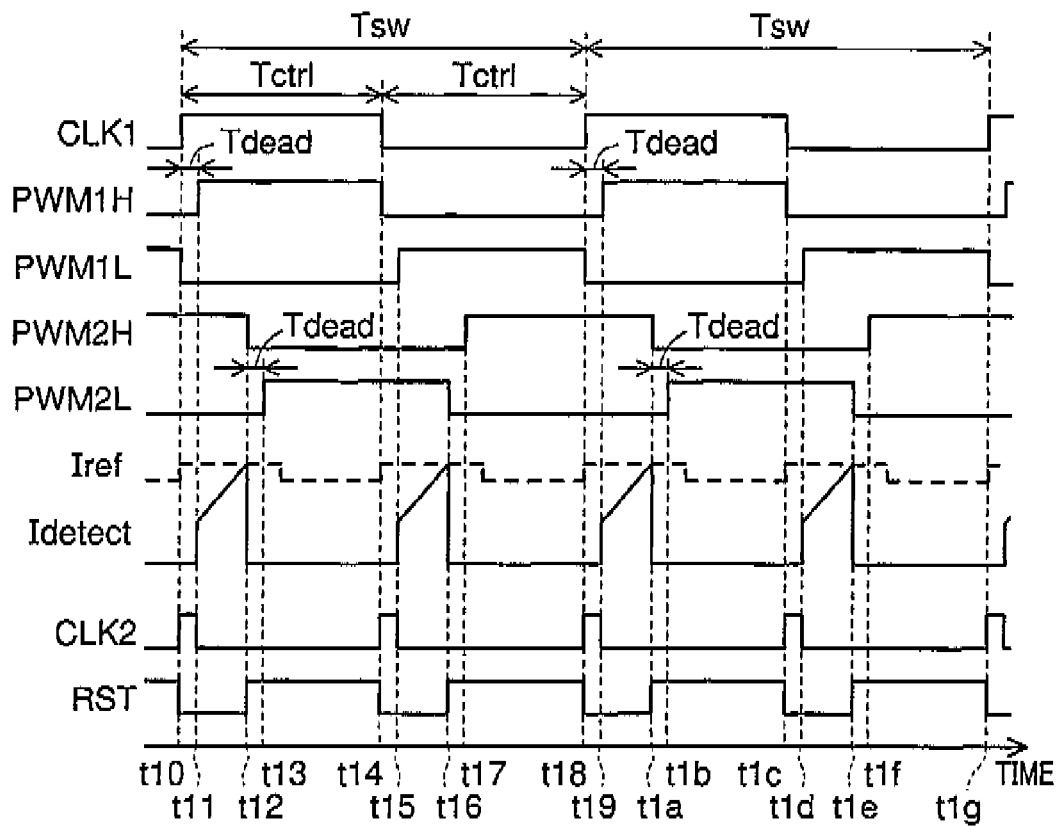
FIG. 3 shows timing diagrams of switching operations of the first embodiment.

Timing diagrams of FIG. 3 show changes in various signals, which are, from the top, the reference signal CLK1, the drive signal PWM1H, the drive signal PWM1L, the drive signal PWM2L, the drive signal PWM2H, the current reference signal Iref, the current detection signal Idetect, the reference signal CLK2, the reset signal RST, over just two switching periods 2Tsw (time periods from time t10 to time t18 and from time t18 to time t1g). Each of the switching modules 10, 11, 12, 13 is turned on/off when corresponding one of the respective drive signal PWM1H, PWM1L, PWM2H, PWM2L toggles from its low/high level to its high/low level.

One-half the switching period Tsw (on time or off time) is here called a control period Tctrl (=Tsw/2). For example, the switching period Tsw of time t10 to time t18 includes a first half period of time t10 to time t14 and a second half period of time t14 to time t18. The first and second half periods are each the control period Tctrl. Every control period Tctrl, the reference signal CLK1 is alternately toggled between its high and low levels and a mono-pulse of the reference signal CLK2 is outputted.

The drive signal PWM1H toggles from its off to its on state at a delay of a dead time Tdead after each rising edge of the reference signal CLK1 from its off to its on state (at times t11, t19), and toggles from its on to its off state at each falling edge of the reference signal CLK1 from its on to its off state (at times t14, t1c). Meanwhile, the drive signal PWM1L toggles from its off to its on state at the dead time Tdead delay after each falling edge of the reference signal CLK1 from its on to its off state (at times t15, t1d), and toggles from its on to its off state at each rising edge of the reference signal CLK1 from its off to its on state (at times t10, t18, t1g).

The drive signal PWM2H toggles from its off to its on state at the dead time Tdead delay (or the delay of the dead time Tdead) after each rising edge of the reset signal RST from its off to its on state while the drive signal PWM2H is in its off state (at times t17, t1f), and toggles from its on to its off state at each rising edge of the reset signal RST from its off to its on state while the drive signal PWM2H is in its on state (at times t12, t1a). Meanwhile, the drive signal PWM2L toggles from its off to its on state at the dead time Tdead delay after each rising edge of the reset signal RST from its off to its on state while the drive signal PWM2L is in its off state (at times t13, t1b), and toggles from its on to its off state at each rising edge of the reset signal RST from its off to its on state while the drive signal PWM2L is in its on state (at times t16, t1e).

The current detection signal Idetect starts to be detected when the drive signal PWM1H or the drive signal PWM1L toggles from its off to its on state (at times t11, t15, t19, t1d). Once the signal value of the current detection signal Idetect reaches the current reference signal Iref (at times t12, t16, t1a, t1e), the current detection signal Idetect ceases to be detected. That is, the reset signal generation unit 6 rises the reset signal RST from its off to its on state when the current detection signal Idetect becomes equal to the current reference signal Iref (Idetect=Iref). The reset signal generation unit 6 lowers the reset signal RST from its on to its off state at each rising edge of the reference signal CLK2 from is off to its on state.

Figure 4:
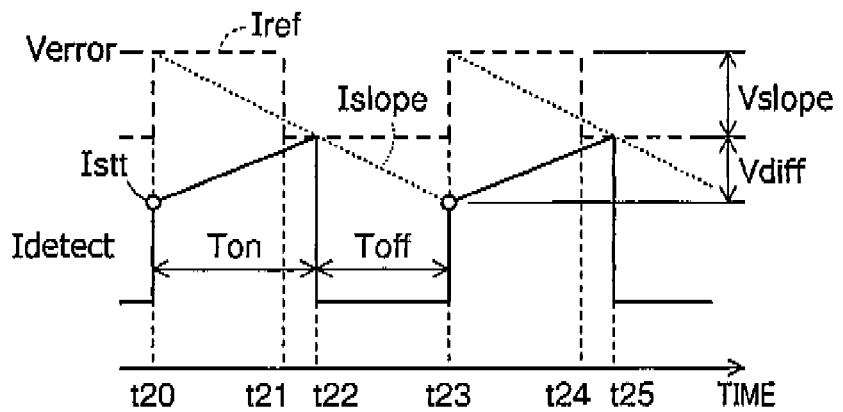
FIG. 4 shows an exemplary timing diagram of slope compensation of the first embodiment.

There will now be explained the principle of the digital slope compensation performed in the slope compensation unit 9 with reference to FIG. 4. The current reference signal Iref, the slope compensation signal Vslope, the difference value Vdiff, the on time Ton, the off time Toff are given by the following equations (1) to (5), respectively. In the equations, "n" is the turns ratio of the transformer Tr, "Lm" the excitation inductance of the transformer Tr, "Lc" the inductance of the reactor L, and "D" the duty ratio Duty.

$$Iref = Verror - Vslope \quad (1)$$

$$Vslope = \frac{Vout}{nLc} \times Ton \quad (2)$$

$$Vdiff = \left(\frac{Vin}{Lm} + \frac{Vin - nVout}{n^2 Lc}\right) \times Ton \quad (3)$$

$$Ton = D \times Tctrl \quad (4)$$

$$Toff = (1 - D) \times Tctrl \quad (5)$$

The current initial value Istt is sampled every control period Tctrl. More specifically, the current initial value Istt is sampled at the beginning of each control period Tctrl (at each of the rising edges of the drive signals PWM1H, PWM1L occurring at times t20, t23). In FIG. 4, each acquired current initial value Istt is indicated by a small circle. In the full-bridge switching section 1 shown in FIG. 2, the current initial value Istt is sampled twice for each switching period Tsw (see FIG. 5). A virtual slope Islope as indicated by the dotted line is a straight line declining from the signal value of the current reference signal Iref at each of the rising edges of the drive signals PWM1H, PWM1L (equal to the error signal Verror, i.e., Iref=Verror). Each line runs through a point at which the signal value of the current detection signal Idetect reaches the signal value of the current reference signal Tref where Tref=Verror−Vslope (at times t22, t25).

In the equation (2) for deriving the slope compensation signal Vslope, the multipliers of the voltage may be generated prior to the present control period Tctrl. This allows a required time period from the acquisition of the current initial value Istt to the update completion of the current reference signal Iref to be reduced, and thereby supporting high-frequency switching operations.

Figure 5:
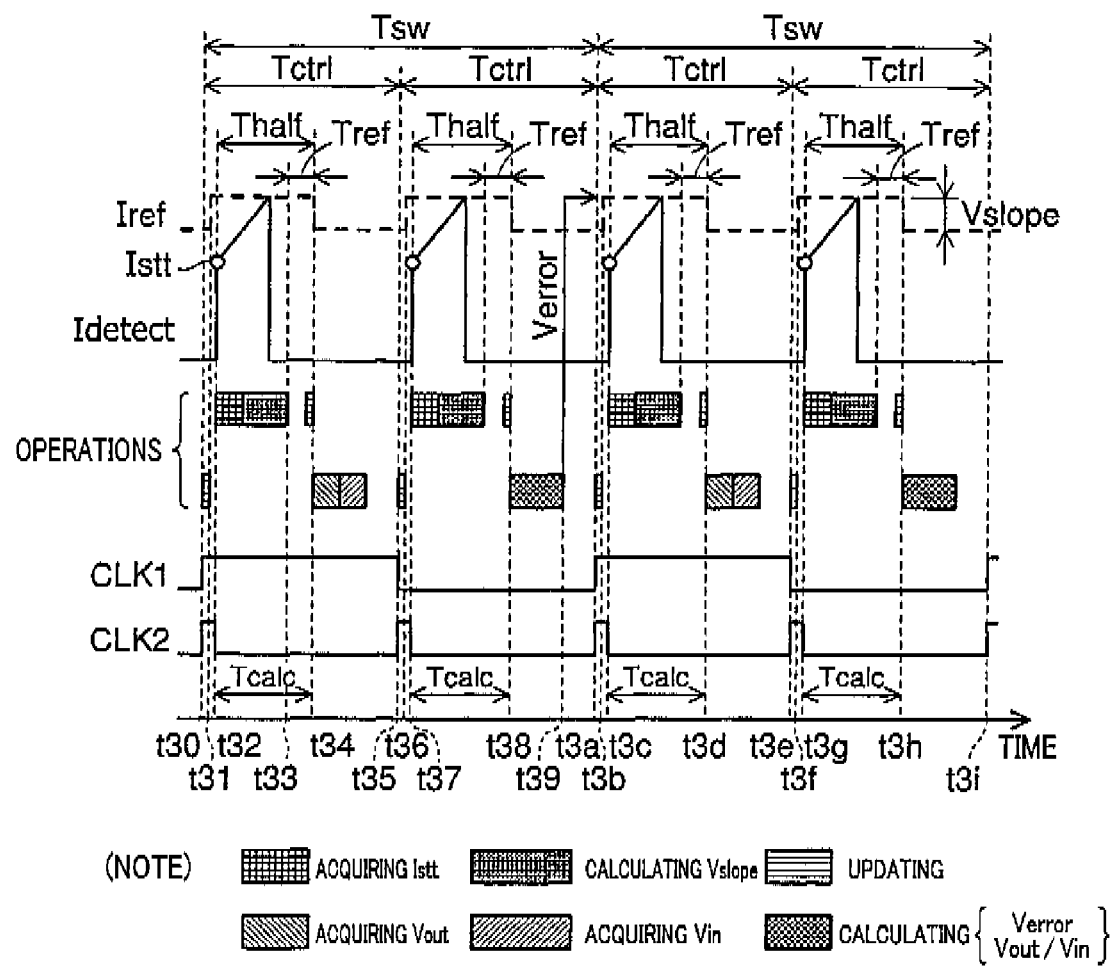
FIG. 5 shows timing diagrams of voltage control of the first embodiment.

The present invention is based on the fact that subharmonic oscillation doesn't occur for the duty ratio Duty of D<0.5 (50%). The timing diagrams of FIG. 5 show changes in various signals, which are, from the top, the current reference signal Iref, the current detection signal Idetect, operations performed in the slope compensation unit 9, the reference signal CLK1, the reference signal CLK2, over just two switching periods 2Tsw (time periods from time t30 to time t3a and from time t3a to time t3i). The operations performed in the slope compensation unit 9 include the acquisition of the current initial value Istt, the calculation of the slope compensation signal Vslope, updating, the acquisition of the output voltage value Vout, the acquisition of the input voltage value Vin, the calculation of the error signal Verror and Vout/Vin, which are indicated by respective discriminable hatchings in the explanatory note.

In FIG. 5, on the basis of the reference signal CLK2, more specifically, on the basis of its rising edges, the slope compensation signal Vslope is negated (at times t30, t35, t3a, t3e) and the current reference signal Tref is set to the error signal Verror (at times t31, t36, t3b, t3f) at the beginning of each control period Tctrl. This leads to reliable voltage control even during the slope calculation period Tcalc for each control period Tctrl.

Figure 11:
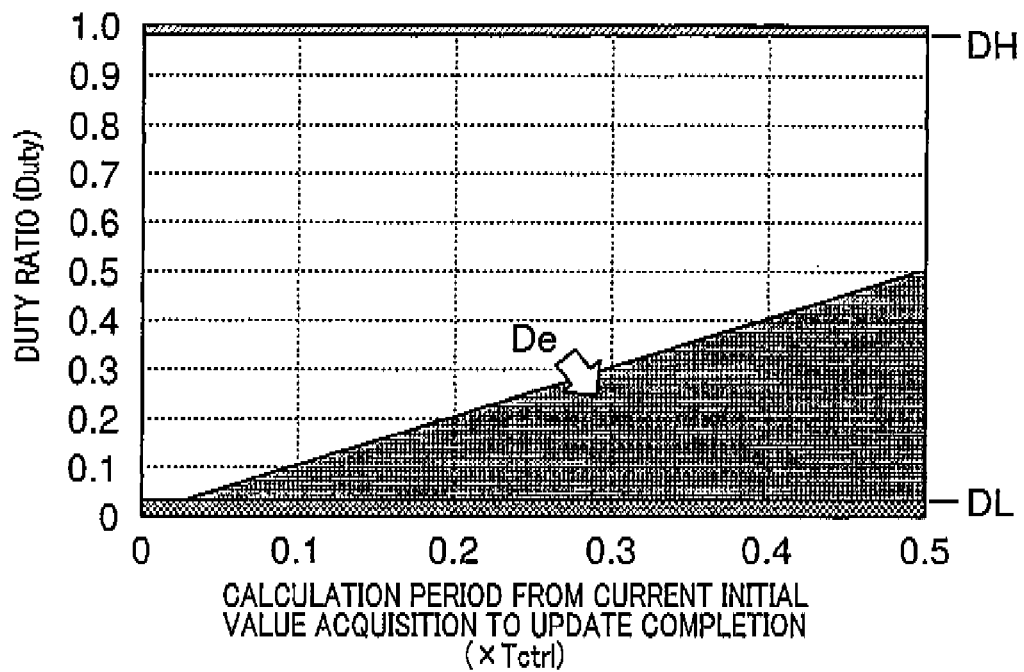
FIG. 11 shows a graph of an extended input and output voltage range of the present invention.
Figure 12:
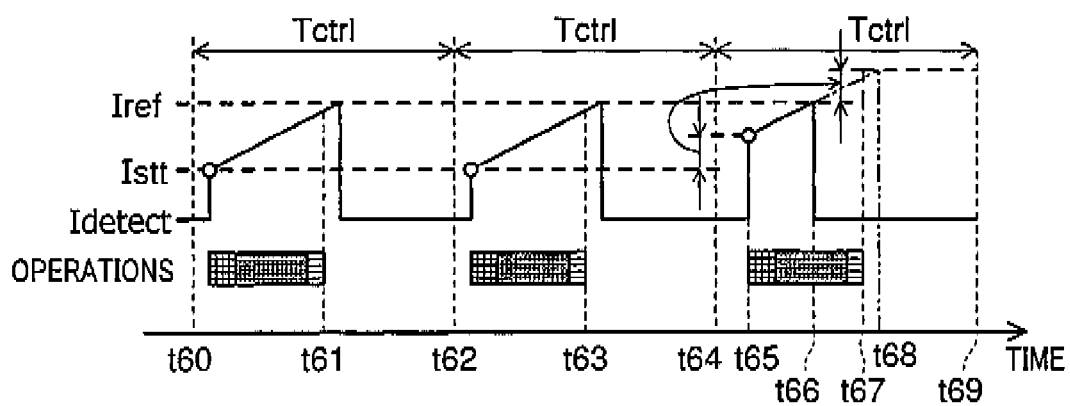
FIG. 12 shows an exemplary timing diagram of conventional digital slope compensation.

The voltage control described above allows the available duty ratio Duty (=nVout/Vin) to be increased as shown in FIG. 11. That is, the voltage control is enabled even in the region as indicated by the hatching in FIG. 11, which leads to an extended input and output voltage range as indicated by the arrow De. In FIG. 11, the duty ratio Duty along the vertical axis ranges 0 (0%) to 1.0 (100%). It should be noted that the region extending from the upper-limit duty ratio DH to the duty ratio Duty of 1.0 is not available due to the presence of the dead time Tdead. In addition, the region extending from the lower limit duty ratio DL to the duty ratio Duty of 0 is not available due to the duty ratio constraints.

Each time period from the calculation completion of the slope compensation signal Vslope to the update completion of the current reference signal Iref is denoted by Tref (e.g., a time period of time t33 to time t34). That is, the current reference signal Iref is updated within each control period Tctrl. This allows the duty ratio Duty to converge rapidly even in the presence of variations in the current detection signal I detect caused by variations in the input voltage value Vin and the electrical load Z, which can stabilize the operations of the power converter.

The updating of the current reference signal Iref reflecting the slope compensation signal Vslope is performed within the time period from the calculation completion of the slope compensation signal Vslope to the timing at which the duty ratio Duty becomes 0.5 (50%) for each control period Tctrl. In FIG. 5, one-half the control period Tctrl is denoted by Thalf (a time period of time t32 to time t34, a time period of time t37 to time t38, a time period of time t3c to time t3d, a time period of time tag to time t3h). The voltage control in such a manner can reliably prevent the subharmonic oscillation from occurring under operating conditions where the duty ratio Duty is above 0.5 (50%). Preferably, update timings of the current reference signal Iref may be fixed on the basis of the reference signal CLK2, which can suppress variations in the duty ratio Duty caused by variations in calculation time and can lead to more stable operations of the power converter.

The first embodiment can provide the following effects.

(1) In the power converter of the present embodiment, each control period Tctrl based on the reference signals CLK1, CLK2 includes a slope calculation period Tcalc in which the slope compensation signal Vslope for the control period Tctrl is calculated. During each slope calculation period Tcalc, the slope compensation unit 9 negates the slope compensation signal Vslope calculated previous to the control period Tctrl including the slope calculation period Tcalc, and the reset signal generation unit 6 compares the current detection signal Idetect with the current instruction that is set to the error signal Verror during the slope calculation period Tcalc to generate the reset signal RST (see FIG. 1 and FIG. 5). With this configuration, during the slope calculation period Tcalc for each control period Tctrl, the slope compensation signal Vslope is negated and the reset signal RST is generated on the basis of the error signal Verror. For each control period Tctrl, the slope compensation signal Vslope calculated previous to or prior to the control period Tctrl is negated, which can more reliably prevent the subharmonic oscillation from occurring irrespective of the duty ratio Duty and leads to an extended input and output voltage range available for the digital current mode voltage control. In addition, the digital current mode voltage control is enabled irrespective of the on time Ton and the increase of costs and dimensions can be suppressed.

(2a) The reset signal generation unit 6 negates the slope compensation signal on the basis of the reference signals CLK1, CLK2 (see FIG. 5). This configuration can more reliably prevent the subharmonic oscillation from occurring irrespective of the duty ratio Duty.

(7) For each control period Tctrl based on the reference signals CLK1, CLK2, the slope compensation unit 9 samples the current detection signal Idetect to calculate the slope compensation signal Vslope (see FIG. 5). In this configuration, the slope compensation signal Vslope is calculated every time the current detection signal Idetect is sampled, which allows the input and output voltage range available for the digital current mode voltage control to be extended more reliably.

(8) The switching section 1 is of full-bridge type, and the slope compensation unit 9 samples the current detection signal Idetect for each half period Thalf that is one-half the switching period Tsw (see FIG. 5). This allows the input and output voltage range available for the digital current mode voltage control to be extended more reliably.

(9) For each control period Tctrl, the slope compensation unit 9 acquires at least one of the error signal Verror, the input voltage value Vin, and the output voltage value Vout prior to the control period Tctrl, to calculate the slope compensation signal Vslope on the basis of the at least one of the error signal Verror, the input voltage value Vin, and the output voltage value Vout within the control period Tctrl (see FIG. 5). This configuration allows the input and output voltage range available for the digital current mode voltage control to be extended more reliably.

(10) The power converter (including the switching section 1 and the control section 20) may be mounted on the vehicle CAR (see FIG. 1). This configuration leads to a vehicle CAR equipped with the power converter such that the digital current mode voltage control is enabled irrespective of the on time Ton and the increase of costs and dimensions can be suppressed.

Second Embodiment

There will now be explained the second embodiment of the present invention with reference to FIG. 6 to FIG. 8, and FIG. 11, where the slope compensation signal is negated on the basis of the reference signal or the reset signal. Only differences of the second embodiment from the first embodiment will be explained. Elements having the same functions as in the first embodiment are assigned the same numbers and will not be described again for brevity.

Figure 6:
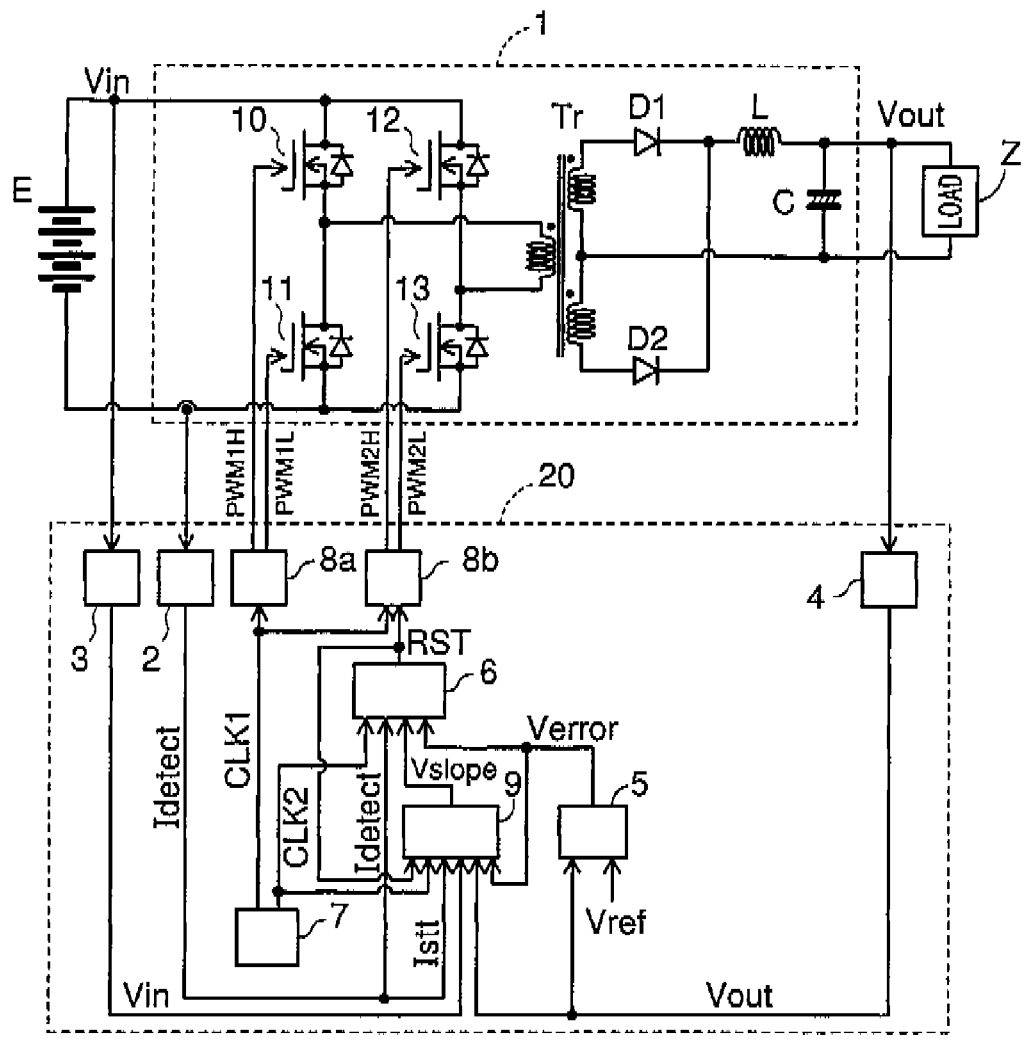
FIG. 6 shows a schematic circuit diagram of a power converter in accordance with a second embodiment of the present invention.

The power converter, including the switching section 1 and the control section 20, of the present embodiment shown in FIG. 6 differs from the power converter, including the switching section 1 and the control section 20, of the first embodiment shown in FIG. 1 in that the slope compensation unit 9 further receives the reset signal RST outputted from the reset signal generation unit 6. The slope compensation unit 9 is configured such that the slope compensation signal Vslope is negated on the basis of the reference signal CLK2 or the reset signal RST.

Figure 7:
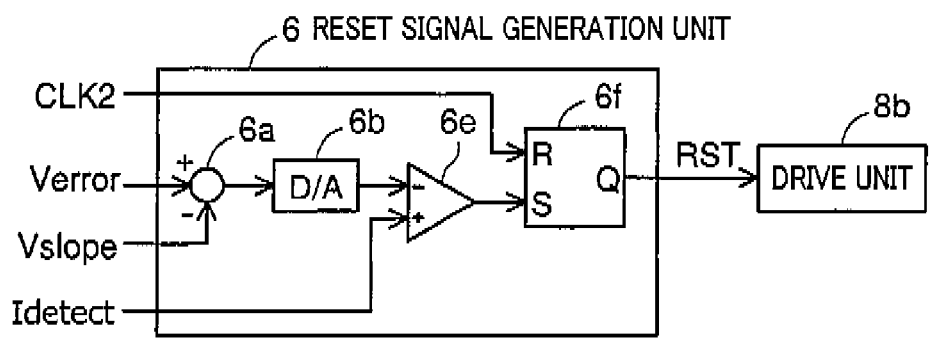
FIG. 7 shows a schematic block diagram of a reset signal generation unit of the second embodiment.

FIG. 7 shows a block diagram of the reset signal generation unit 6. The reset signal generation unit 6 includes an add-subtractor 6a, a D/A converter 6b, an operational amplifier 6e, and a flip-flop 6f and others. The add-subtractor 6a subtracts the slope compensation signal Vslope from the error signal Verror to output the current reference signal Tref (=Verror−Vslope). Without the slope compensation signal Vslope, the current reference signal Tref is equal to the error signal Verror (Iref=Verror). The D/A converter 6b converts the digital current reference signal Tref into an analog signal to output an analog current reference signal Iref. The operational amplifier 6e calculates and outputs a difference value between the current detection signal Idetect and the current reference signal Iref, i.e., Idetect−Iref. The flip-flop 6f is an SR flip-flop. The flip-flop 6f receives the reference signal CLK2 via a reset terminal R and the difference value outputted from the operational amplifier 6e via a terminal S, and outputs a reset signal RST via an output terminal Q. When the difference value outputted from the operational amplifier 6e exceeds a threshold (becomes "high"), the reset signal RST toggles from its off to its on state. When the reference signal CLK2 toggles from its off to its on state, the reset signal RST toggles from its on to its off state.

With this configuration of the reset signal generation unit 6, the current reference signal Iref is updated to a first current instruction (Verror) on the basis of the reference signal CLK2, and kept at the error signal Verror during the slope calculation period Tcalc for each control period Tctrl. The current reference signal Iref is updated to and kept at a second current instruction (Verror−Vslope) outside of the slope calculation period Tcalc for each control period Tctrl. The timing of updating the current reference signal Iref to the second current instruction is set within a time period from the calculation completion of the slope compensation signal Vslope to the timing at which the duty ratio Duty becomes 0.5 (50%). Updating of the current reference signal Iref from the first current instruction to the second current instruction is performed at predefined timings based on the reference signals CLK1, CLK2, which allows the slope compensation signal Vslope to be negated reliably until the beginning of each control period Tctrl. This operation will be explained with reference to FIG. 8.

Figure 8:
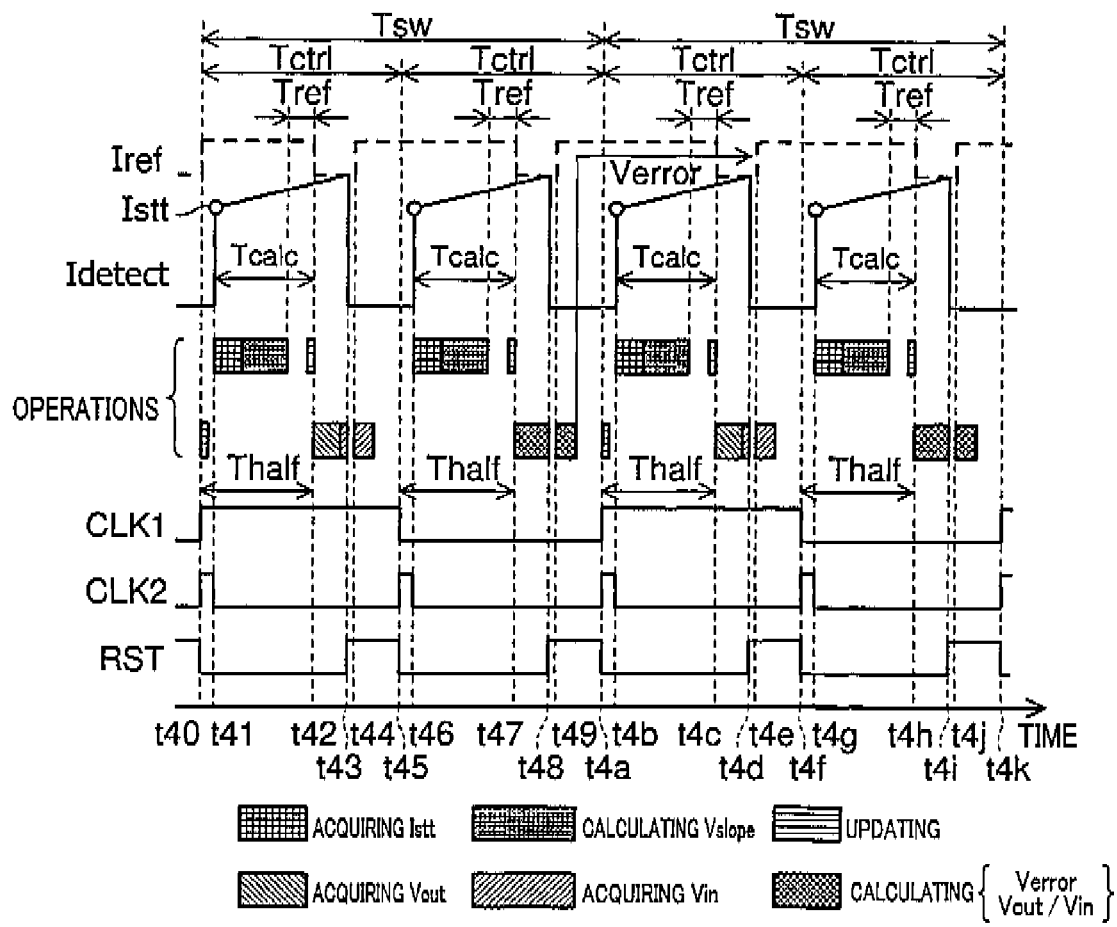
FIG. 8 shows timing diagrams of voltage control of the second embodiment.

The timing diagrams of FIG. 8 show changes in various signals, which are, from the top, the current reference signal Iref, the current detection signal Idetect, operations performed in the slope compensation unit 9, the reference signal CLK1, the reference signal CLK2, and the reset signal RST, over just two switching periods 2Tsw (time periods from time t40 to time t4a and from time 4a to time t4k). The operations performed in the slope compensation unit 9 include the acquisition of the current initial value Istt, the calculation of the slope compensation signal Vslope, the updating, the acquisition of the output voltage value Vout, the acquisition of the input voltage value Vin, the calculation of the error signal Verror and Vout/Vin, which are indicated by respective discriminable hatchings in the explanatory note.

In FIG. 8, on the basis of the reference signal CLK2 or the reset signal RST, more specifically, on the basis of their rising edges, the slope compensation signal Vslope is negated (at times t40, t45, t4a, t4f) and the current reference signal Iref is set to the error signal Verror (at times t44, t49, t4e, t4j) at the beginning of each control period Tctrl. This leads to reliable voltage control even during the slope calculation period Tcalc for each control period Tctrl. Hence, as in the first embodiment, the voltage control described above allows the available duty ratio Duty (=nVout/Vin) to be increased as shown in FIG. 11. That is, the voltage control is enabled even in the region as indicated by the hatching in FIG. 11, which leads to an extended input and output voltage range.

Each time period from the calculation completion of the slope compensation signal Vslope to the update completion of the current reference signal Tref is denoted by Tref as shown in FIG. 8. That is, the current reference signal Iref is updated within each control period Tctrl. This allows the duty ratio Duty to converge rapidly even in the presence of variations in the current detection signal Idetect caused by variations in the input voltage value Vin and the electrical load Z, which can stabilize the operations of the power converter.

The updating of the current reference signal Tref reflecting the slope compensation signal Vslope is performed within the time period from the calculation completion of the slope compensation signal Vslope to the timing at which the duty ratio Duty becomes 0.5 (50%) for each control period Tctrl. As in the first embodiment, FIG. 8 shows Thalf that is one-half the control period Tctrl and the slope calculation period Tcalc. The voltage control in such a manner can reliably prevent the subharmonic oscillation from occurring under operating conditions where the duty ratio Duty is above 0.5 (50%). Preferably, update timings of the current reference signal Iref may be fixed on the basis of the reference signal CLK2, which can suppress variations in the duty ratio Duty caused by variations in calculation time and can lead to more stable operations of the power converter.

The second embodiment provides the following effects. Since the power converter of the second embodiment is similar in configuration to the power converter of the first embodiment, similar effects, except for the effect (2a), can be provided.

(2b) The reset signal generation unit 6 negates the slope compensation signal Vslope on the basis of the reference signals CLK2 or the reset signal RST (see FIG. 6 to FIG. 8). This configuration can more reliably prevent the subharmonic oscillation from occurring irrespective of the duty ratio Duty.

(3) For each control period Tctrl, the reset signal generation unit 6 updates the current instruction Iref to the first current instruction that is the error signal Verror on the basis of the reference signals CLK2 or the reset signal RST, where the current instruction Iref is kept at the first current instruction (Verror) during the slope calculation period Tcalc, and updates the current instruction Tref to the second current instruction that is the error signal Verror minus the slope compensation signal Vslope (Verror−Vslope) outside of the slope calculation period Tcalc (see FIG. 8). In this configuration, the current instruction Iref is allowed to be updated selectively to the first or second current instruction at appropriate timings during each control period Tctrl. This can more reliably prevent the subharmonic oscillation from occurring irrespective of the duty ratio Duty.

(5a) The reset signal generation unit 6 is configured such that the timing of updating the current reference signal Tref to the second current instruction is within the time period from the calculation completion of the slope compensation signal Vslope to the timing at which the duty ratio Duty becomes 0.5 (50%) (see FIG. 8). This can more reliably prevent the subharmonic oscillation from occurring irrespective of the duty ratio Duty.

(6a) The reset signal generation unit 6 is configured such that the updating of the current instruction Iref from the first current instruction to the second current instruction is performed at predefined timings based on the reference signal CLK2 (see FIG. 8). This configuration allows the input and output voltage range available for the digital current mode voltage control to be extended more reliably.

Third Embodiment

There will now be explained a third embodiment of the present invention with reference to FIG. 9 to FIG. 11, where, as in the second embodiment, the slope compensation signal is negated on the basis of the reference signal or the reset signal. Only differences of the third embodiment from the first and second embodiments will be explained. Elements having the same functions as in the first and second embodiments are assigned the same numbers and will not be described again for brevity.

Figure 9:
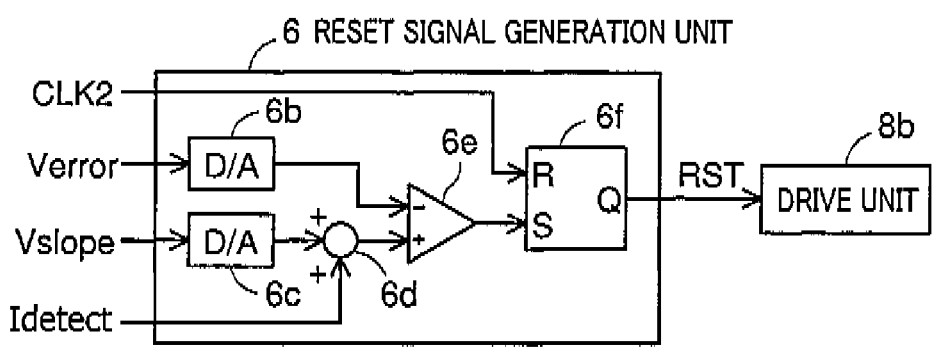
FIG. 9 shows a schematic block diagram of a reset signal generation unit of a third embodiment.

FIG. 9 shows a block diagram of the reset signal generation unit 6, as alternative to the reset signal generation unit 6 shown in FIG. 7. In the third embodiment, the slope compensation is performed by adding the slope compensation signal Vslope to the current detection signal Idetect while in the second embodiment the slope compensation is performed by subtracting the slope compensation signal Vslope from the error signal Verror.

The reset signal generation unit 6 shown in FIG. 9 includes D/A converters 6b, 6c, an adder 6d, an operational amplifier 6e, a flip-flop 6f and others. The D/A converter 6c converts the digital slope compensation signal Vslope into an analog signal to output an analog slope compensation signal Vslope. The adder 6d adds the current detection signal Idetect to the analog slope compensation signal Vslope. The operational amplifier 6e calculates a difference value between the analog error signal Verror and the output signal of the adder 6d that is Idetect+Vslope, and outputs the difference value, i.e., Idetect+Vslope−Verror.

With this configuration of the reset signal generation unit 6, a current instruction Iref is set to the error signal Verror, the current detection signal Idetect is a first comparative signal, and a signal that is the current detection signal Idetect plus the slope compensation signal Vslope, i.e., Idetect+Vslope, is a second comparative signal. The comparative signal Comp is updated to the first comparative signal (Idetect) on the basis of the reference signal CLK2 or the reset signal RST and kept at the first comparative signal during the slope calculation period Tcalc for each control period Tctrl. The comparative signal Comp is updated to the second comparative signal (Idetect+Vslope) outside of the slope calculation period Tcalc for each control period Tctrl. The timing of updating the comparative signal Comp to the second comparative signal is within the time period from the calculation completion of the slope compensation signal Vslope to the timing at which the duty ratio Duty becomes 0.5 (50%). Updating of the comparative signal Comp from the first comparative signal to the second comparative signal is performed at predefined timings based on the reference signals CLK1, CLK2, which allows the slope compensation signal Vslope to be negated reliably until the beginning of each control period Tctrl. This operation will be explained with reference to FIG. 10.

Figure 10:
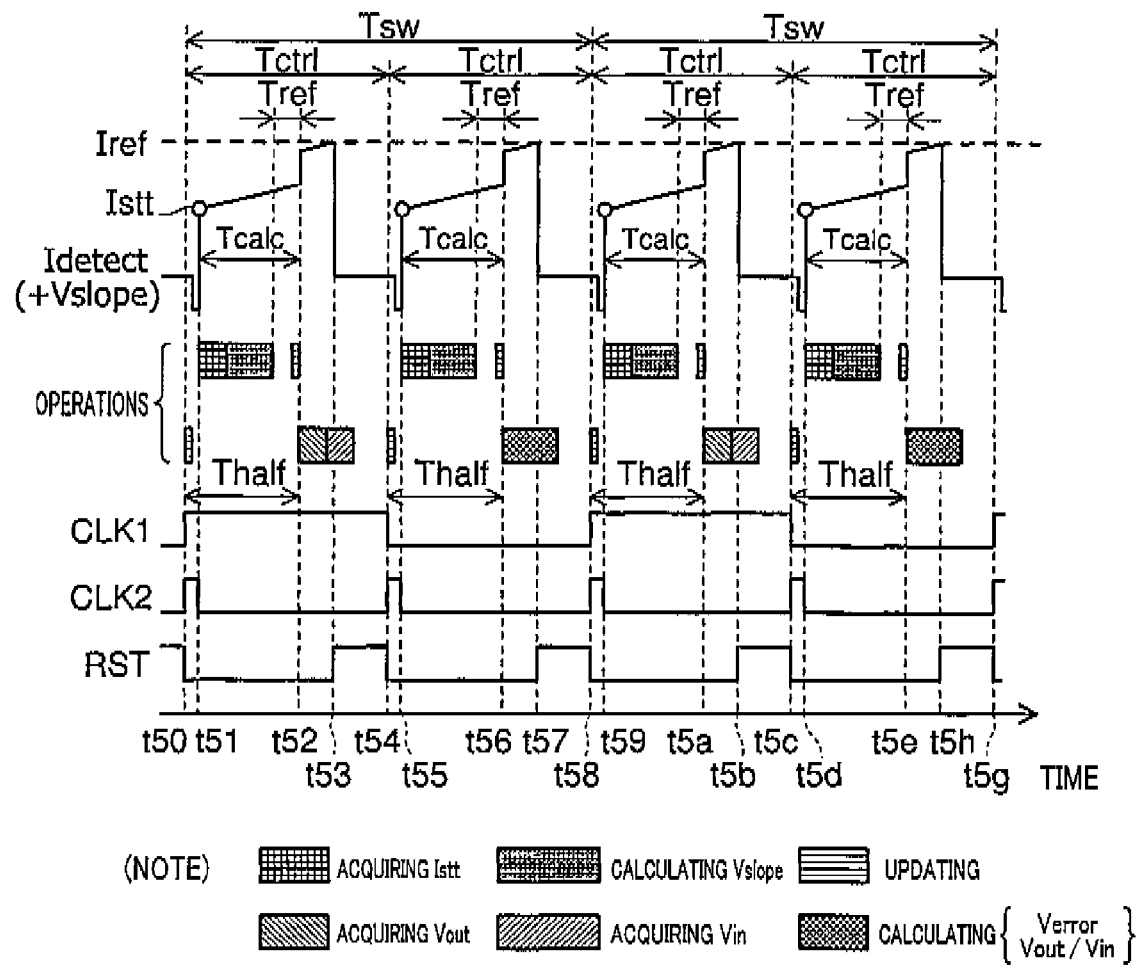
FIG. 10 shows timing diagrams of voltage control of the third embodiment.

As in the second embodiment, the timing diagrams of FIG. 10 show changes in various signals, which are, from the top, the current reference signal Iref, the current detection signal Idetect with the slope compensation signal Vslope added thereto, operations performed in the slope compensation unit 9, the reference signal CLK1, the reference signal CLK2, and the reset signal RST, over just two switching periods 2Tsw (time periods from time t50 to time t58 and from time 58 to time t5h). The operations performed in the slope compensation unit 9 include the acquisition of the current initial value Istt, the calculation of the slope compensation signal Vslope, the updating, the acquisition of the output voltage value Vout, the acquisition of the input voltage value Vin, the calculation of the error signal Verror and Vout/Vin, which are indicated by respective discriminable hatchings in the explanatory note.

In FIG. 10, the current reference signal Iref is kept at a constant value. On the basis of the reference signal CLK2 or the reset signal RST, more specifically, on the basis of their rising edges, the slope compensation signal Vslope is negated (at times t50, t54, t58, t5c, t5g) at the beginning of each control period Tctrl. As in FIG. 8, each time period from the calculation completion of the slope compensation signal Vslope to the update completion of the comparative signal Comp is denoted by Tref. The updating of the comparative signal Comp reflecting the slope compensation signal Vslope is performed within the time period from the calculation completion of the slope compensation signal Vslope to the timing at which the duty ratio Duty becomes 0.5 (50%) for each control period Tctrl.

The third embodiment provides the following effects. Since the power converter of the third embodiment is similar in configuration to the power converter of the first embodiment, similar effects as in the first and second embodiments, except for the effect (2a), can be provided.

(4) For each control period Tctrl, the reset signal generation unit 6 updates the comparative signal Comp to the first comparative signal that is the current detection signal Idetect on the basis of the reference signals CLK2 or the reset signal RST, where the comparative signal Comp is kept at the first comparative signal (Idetect) during the slope calculation period Tcalc, and updates the comparative signal Comp to the second comparative signal that is the current detection signal Idetect plus the slope compensation signal Vslope (Idetect+Vslope) outside of the slope calculation period (see FIG. 9, FIG. 10). The comparative signal Comp is compared with the current instruction that is the error signal Verror. In this configuration, the comparative signal Comp is allowed to be updated selectively to the first or second comparative signal at appropriate timings for each control period Tctrl. This can more reliably prevent the subharmonic oscillation from occurring irrespective of the duty ratio Duty.

(5) The reset signal generation unit 6 is configured such that the timing of updating the comparative signal Comp to the second comparative signal is within the time period from the calculation completion of the slope compensation signal Vslope to the timing at which the duty ratio Duty becomes 0.5 (50%) (see FIG. 10). This can more reliably prevent the subharmonic oscillation from occurring irrespective of the duty ratio Duty.

(6b) The reset signal generation unit 6 is configured such that the updating of the comparative signal Comp from the first comparative signal to the second comparative signal is performed at predefined timings based on the reference signal CLK2 (see FIG. 10). This configuration allows the input and output voltage range available for the digital current mode voltage control to be extended more reliably.

Other Embodiments

While the present invention has been described with respect to a limited number of embodiments, i.e., the first to third embodiments, those skilled in the art will appreciate numerous other embodiments. There will now be explained some other embodiments that may be devised without departing from the spirit and scope of the present invention.

In the first to third embodiments described above, the switching section 1 serves as a DC-DC converter (see FIG. 2, FIG. 6). Alternatively, the switching section 1 may include a single- or multi-phase inverter. For example, in the case of the single-phase inverter, the transformer Tr, the rectification circuit (formed of the diodes D1, D2), the smoothing circuit (formed of the reactor L and the capacitor C) may be removed. In the case of the multi-phase inverter, plural (e.g., three or six) equal sets of the switching modules 10, 11, 12, 13 may be provided, where the phase-number of pairs of upper- and lower-arm switching modules may be provided. Since these alternative embodiments only differ in switching timing or switching frequency from the first to third embodiments, these alternative embodiments can provide similar effects to the first to third embodiments.

In the first to third embodiments described above, the switching modules 10, 11, 12, 13 are used to provide a full-bridge power converter operable to convert a DC voltage (direct-current (DC) power) into an AC voltage (alternating-current (AC) power) (see FIG. 2, FIG. 6). Alternatively, the number of switching modules may be reduced. For example, a reduced number of switching modules may be used to provide a half-bridge or push-pull power converter. Still alternatively, a plurality of (e.g., two or four) forward or flyback circuits may be electrically connected to the primary of the transformer Tr. Since these alternative embodiments only differ in switching module configuration or electrical connection to the primary of the transformer Tr from the first to third embodiments, these alternative embodiments can provide similar effects to the first to third embodiments.

In the first to third embodiments described above, the current is detected at the input side of the switching section 1 to output the current detection signal Idetect (see FIG. 2, FIG. 6). Alternatively, a current flowing through the transformer Tr (whether through the primary or through the secondary thereof) or a current flowing through the reactor L may be detected, where the current initial value Istt depends on the current detecting positions. Since these alternative embodiments only differ in current detecting position from the first to third embodiments, these alternative embodiments can provide similar effects to the first to third embodiments.

In the first to third embodiments described above, the buck and isolation transformer Tr having the center tap at the secondary side is used (see FIG. 2, FIG. 6). Alternatively, a transformer without the center tap at the secondary side or a boost and isolation transformer may be used. In the alternative embodiments where the transformer without the center tap at the secondary side is used, full-wave rectification utilizing a diode bridge or half-wave rectification may be implemented. Since these alternative embodiments only differ in transformer configuration from the first to third embodiments, these alternative embodiments can provide similar effects to the first to third embodiments.

In the first to third embodiments described above, the switching modules 10, 11, 12, 13 are positive enabling (see FIG. 3). Alternatively, the switching modules 10, 11, 12, 13 may be negative enabling. Since these alternative embodiments only differ in logical operations from the first to third embodiments, these alternative embodiments can provide similar effects to the first to third embodiments.

In the first to third embodiments described above, the LC circuit including the reactor L and the capacitor C is used as a smoothing circuit (see FIG. 2, FIG. 6). Additionally or alternatively, smoothing circuits having other configurations may be used. For example, a resistor-capacitor (RC) circuit including a resistor and a capacitor, or an active low-pass filter including an operational amplifier may be used. Still alternatively, a digital filter may be used instead of these analog filters. Preferably, these smoothing circuits may be able to remove high-frequency components of a DC voltage. Since in these alternative embodiments high-frequency components of the DC voltage can be removed, these alternative embodiments can provide similar effects to the first to third embodiments.

In the first to third embodiments described above, each of the switching modules 10, 11, 12, 13 is an N-channel MOSFET (see FIG. 2, FIG. 6). Alternatively, another kind of switching element may be used. For example, FET (e.g., P-channel MOSFET, JFET, MESFET etc.), IGBT, GTO, a power transistor or the like may be used. Since these switching elements can convert a DC voltage (an input voltage value Vin) into a desired AC voltage (an output voltage value Vout), these alternative embodiments can provide similar effects to the first to third embodiments.

Many modifications and other embodiments of the invention will come to mind to one skilled in the art to which this invention understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A current mode controlled power converter comprising:
   a switching unit configured to convert an input voltage into a desired output voltage through a switching operation;
   a current detection unit configured to detect a current flowing through the switching unit;
   an input voltage detection unit configured to detect the input voltage;
   an output voltage detection unit configured to detect the output voltage;
   an error signal generation unit configured to generate an error signal on the basis of the output voltage detected by the output voltage detection unit and a voltage instruction value;
   a slope compensation unit configured to calculate and output a slope compensation signal on the basis of the current detection signal, the input voltage, and the output voltage;
   a reset signal generation unit configured to generate a reset signal on the basis of the current detection signal, the error signal, and the slope compensation signal;
   a reference signal generation unit configured to generate a reference signal having a predetermined period; and
   a drive unit configured to generate a drive signal on the basis of the reset signal and the reference signal to drive the switching unit,
   wherein each control period based on the reference signal includes a slope calculation period in which the slope compensation signal for the control period is calculated, and
   during each slope calculation period, the slope compensation unit negates the slope compensation signal calculated previous to the control period including the slope calculation period, and the reset signal generation unit compares the current detection signal with a current instruction set to the error signal to generate the reset signal.

2. The power converter of claim 1, wherein the reset signal generation unit negates the slope compensation signal on the basis of the reference signal or the reset signal.

3. The power converter of claim 2, wherein the reset signal generation unit is configured to, for each control period, update the current instruction to a first current instruction that is the error signal on the basis of the reference signal or the reset signal, the current instruction being kept at the first current instruction during the slope calculation period of the control period, and update the current instruction to a second current instruction that is the error signal minus the slope compensation signal outside of the slope calculation period of the control period.

4. The power converter of claim 2, wherein,
the current instruction is set to the error signal, and
the reset signal generation unit is configured to, for each control period, update a comparative signal to a first comparative signal that is the current detection signal on the basis of the reference signal or the reset signal, the comparative signal being kept at the first comparative signal during the slope calculation period of the control period, and update the comparative signal to a second comparative signal that is the current detection signal plus the slope compensation signal outside of the slope calculation period of the control period.

5. The power converter of claim 3, wherein the reset signal generation unit is configured such that the timing of updating the current instruction to the second current instruction is set within a time period from the calculation completion of the slope compensation signal to the timing at which a duty ratio becomes 0.5.

6. The power converter of claim 4, wherein the reset signal generation unit is configured such that the timing of updating the comparative signal to the second comparative signal is set within a time period from the calculation completion of the slope compensation signal to the timing at which a duty ratio becomes 0.5.

7. The power converter of claim 3, wherein the reset signal generation unit is configured such that the timing of updating the current instruction from the first current instruction to the second current instruction is set at a predefined timing based on the reference signal.

8. The power converter of claim 4, wherein the reset signal generation unit is configured such that the timing of updating the comparative signal from the first comparative signal to the second comparative signal is set at a predefined timing based on the reference signal.

9. The power converter of claim 1, wherein the slope compensation unit is configured to, for each control period based on the reference signal, sample the current detection signal to calculate the slope compensation signal.

10. The power converter of claim 9, wherein the switching unit is of full-bridge type, and the slope compensation unit is configured to sample the current detection signal every half-period of a switching period of the switching operation.

11. The power converter of claim 9, wherein the slope compensation unit is configured to, for each control period, acquire at least one of the error signal, the input voltage value, and the output voltage value, prior to the control cycle, and then calculate the slope compensation signal within the control period.

12. The power converter of claim 1, wherein the power converter is mounted in a vehicle.

* * * * *